(12) United States Patent
Gao et al.

(10) Patent No.: US 10,868,278 B2
(45) Date of Patent: Dec. 15, 2020

(54) DISPLAY PANEL AND DISPLAY DEVICE HAVING MULTIPLE SUB-CAPPING LAYERS

(71) Applicant: WUHAN TIANMA MICRO-ELECTRONICS CO., LTD., Wuhan (CN)

(72) Inventors: Wei Gao, Shanghai (CN); Lei Zhang, Shanghai (CN); Qing Zhu, Shanghai (CN); Jinghua Niu, Shanghai (CN); Ping An, Shanghai (CN); Yan Lu, Shanghai (CN); Hongyan Zhu, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/415,820

(22) Filed: May 17, 2019

(65) Prior Publication Data
US 2020/0212361 A1    Jul. 2, 2020

(30) Foreign Application Priority Data

Dec. 29, 2018   (CN) .......................... 2018 1 1655144

(51) Int. Cl.
*H01L 51/52*   (2006.01)
*H01L 51/50*   (2006.01)
*H01L 27/15*   (2006.01)

(52) U.S. Cl.
CPC ...... *H01L 51/5275* (2013.01); *H01L 51/5036* (2013.01); *H01L 51/5268* (2013.01); *H01L 27/153* (2013.01)

(58) Field of Classification Search
CPC ............. H01L 51/5275; H01L 51/5036; H01L 51/5268; H01L 27/153
See application file for complete search history.

(56) References Cited

U.S. PATENT DOCUMENTS 6,630,366 B2* 10/2003 Taniguchi ............... H01L 33/38
                                                     438/34
6,730,936 B2*  5/2004 Yukimoto ................. B41J 2/45
                                                     257/622

(Continued)

FOREIGN PATENT DOCUMENTS

CN       106684263 A    5/2017
CN       103682145 B    8/2018

*Primary Examiner* — Ida M Soward
(74) *Attorney, Agent, or Firm* — Anova Law Group PLLC (57) ABSTRACT

A display panel includes a light-emitting element and a capping layer disposed at a light exit side of the light-emitting element. The light-emitting element includes a first light-emitting element, a second light-emitting element and a third light-emitting element emitting a first color light, a second color light and a third color light, respectively. The capping layer includes a first capping layer and a second capping layer stacked together. The second capping layer includes a first sub-capping layer, a second sub-capping layer and a third sub-capping layer correspondingly disposed at light exit sides of the first light-emitting element, the second light-emitting element and the third light-emitting element, respectively. At least one of the first sub-capping layer, the second sub-capping layer, or the third sub-capping layers is configured to have a larger refractive index of light emitted by the corresponding light-emitting element than light emitted by other light-emitting elements.

20 Claims, 4 Drawing Sheets

(56) References Cited

U.S. PATENT DOCUMENTS

| | | | |
|---|---|---|---|
| 8,212,269 B2* | 7/2012 | Karg | H01L 51/5262 257/98 |
| 9,112,085 B2* | 8/2015 | Mi | H01L 31/03044 |
| 9,166,204 B2* | 10/2015 | Park | H01L 51/5064 |
| 9,570,701 B2* | 2/2017 | Lee | H01L 51/5016 |
| 10,008,684 B2* | 6/2018 | Pyo | H01L 51/5096 |
| 10,121,829 B2* | 11/2018 | Ito | H01L 51/5056 |
| 10,211,417 B2* | 2/2019 | Kim | H01L 51/5265 |
| 10,229,954 B2* | 3/2019 | Park | H01L 51/5044 |
| 10,256,438 B2* | 4/2019 | Kim | H01L 51/5036 |
| 2013/0285023 A1* | 10/2013 | Kurata | H01L 51/56 257/40 |
| 2016/0013412 A1* | 1/2016 | Harikrishna Mohan | H01L 51/5265 438/29 |
| 2016/0223869 A1* | 8/2016 | Sim | G02F 1/133377 |
| 2019/0165037 A1* | 5/2019 | Chae | H01L 25/13 |
| 2019/0189702 A1* | 6/2019 | Park | H01L 51/5044 |
| 2020/0006439 A1* | 1/2020 | Sun | H01L 51/5056 |

* cited by examiner

DISPLAY PANEL AND DISPLAY DEVICE HAVING MULTIPLE SUB-CAPPING LAYERS

CROSS-REFERENCES TO RELATED APPLICATIONS

This application claims the priority of Chinese Patent Application No. CN201811655144.5, filed on Dec. 29, 2018, the entire contents of all of which are incorporated herein by reference.

FIELD OF THE DISCLOSURE

The present disclosure generally relates to the display technology and, more particularly, relates to a display panel and a display device thereof.

BACKGROUND

With the continuous development of display technology, the consumer demands for display panels are constantly increasing, and various types of display panels have been emerging and rapidly developed, such as liquid crystal display (LCD) panels, and organic light-emitting display panels, etc. Display technologies such as three-dimensional (3D) display, touch control display, curved display, ultra-high resolution display and peep-proof display are emerging to meet the various consumer demands.

Organic light-emitting display panels are widely favored by consumers because of light weight, good flexibility, high contrast ratio, and low power consumption, etc., and the market share in the display field is increasing year by year. In organic light-emitting display panels, an organic light-emitting element is a key component for generating and emitting light, and the light extraction efficiency of the organic light-emitting element directly affects the light extraction efficiency and power consumption of the display panel. In the organic light-emitting element, a capping layer or a light extraction layer is often disposed at a light exit side of the organic light-emitting element, through which the light emitted by the light-emitting element is further extracted to prevent the light from being reflected back to the light-emitting element due to the total internal reflection, thereby improving the light extraction efficiency of the display panel.

However, in the organic light-emitting full-color display, light-emitting elements of different colors such as red, green, and blue are separately disposed, while the same capping layer has different refractive indices for light of different colors. Thus, it is difficult to enhance the light extraction efficiency of light in different colors, which results in light loss. Therefore, how to improve the light extraction efficiency of light in different colors to further improve the light extraction efficiency of the display panel and optimize the contrast ratio is a technical problem highly desired to be solved in the field.

The disclosed display panel and display device thereof are directed to solve one or more problems set forth above and other problems.

BRIEF SUMMARY OF THE DISCLOSURE

One aspect of the present disclosure provides a display panel. The display panel comprises a light-emitting element and a capping layer disposed at a light exit side of the light-emitting element. The light-emitting element includes a first light-emitting element that emits a first color light having a wavelength range of $\lambda 1$ to $\lambda 2$, a second light-emitting element that emits a second color light having a wavelength range of $\lambda 3$ to $\lambda 4$ and a third light-emitting element that emits a third color light having a wavelength range of $\lambda 5$ to $\lambda 6$. The capping layer includes a first capping layer and a second capping layer stacked together. The first capping layer has a first side facing the light exit side of the light-emitting element and an opposing second side, and the second capping layer is disposed at the first side of the first capping layer. The second capping layer includes a first sub-capping layer correspondingly disposed at a light exit side of the first light-emitting element, a second sub-capping layer correspondingly disposed at a light exit side of the second light-emitting element and a third capping layer correspondingly disposed at a light exit side of the third light-emitting element. At least one of the first sub-capping layer, the second sub-capping layer, or the third sub-capping layers is configured to have a larger refractive index of light emitted by the corresponding light-emitting element than light emitted by other light-emitting elements.

Another aspect of the present disclosure provides a display device. The display device comprises a display panel. The display panel comprises a light-emitting element and a capping layer disposed at a light exit side of the light-emitting element. The light-emitting element includes a first light-emitting element that emits a first color light having a wavelength range of $\lambda 1$ to $\lambda 2$, a second light-emitting element that emits a second color light having a wavelength range of $\lambda 3$ to $\lambda 4$ and a third light-emitting element that emits a third color light having a wavelength range of $\lambda 5$ to $\lambda 6$. The capping layer includes a first capping layer and a second capping layer stacked together. The first capping layer has a first side facing the light exit side of the light-emitting element and an opposing second side, and the second capping layer is disposed at the first side of the first capping layer. The second capping layer includes a first sub-capping layer correspondingly disposed at a light exit side of the first light-emitting element, a second sub-capping layer correspondingly disposed at a light exit side of the second light-emitting element and a third capping layer correspondingly disposed at a light exit side of the third light-emitting element. At least one of the first sub-capping layer, the second sub-capping layer, or the third sub-capping layers is configured to have a larger refractive index of light emitted by the corresponding light-emitting element than light emitted by other light-emitting elements.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which may be illustrated in the accompanying drawings. Hereinafter, embodiments consistent with the disclosure will be described with reference to drawings. Wherever possible, the same reference numbers will be used throughout the drawings to refer to the same or like parts. It may be apparent that the described embodiments may be some but not all of the embodiments of the present disclosure. Based on the disclosed embodiments, persons of ordinary skill in the art may derive other embodiments consistent with the present disclosure, all of which may be within the scope of the present disclosure. Further, in the present disclosure, the disclosed embodiments and the features of the disclosed embodiments may be combined under conditions without conflicts.

The present disclosure provides a display panel which is capable of improving the light extraction of light in different colors to further improve the light extraction efficiency of the display panel and optimize the contrast ratio.

Figure 1:
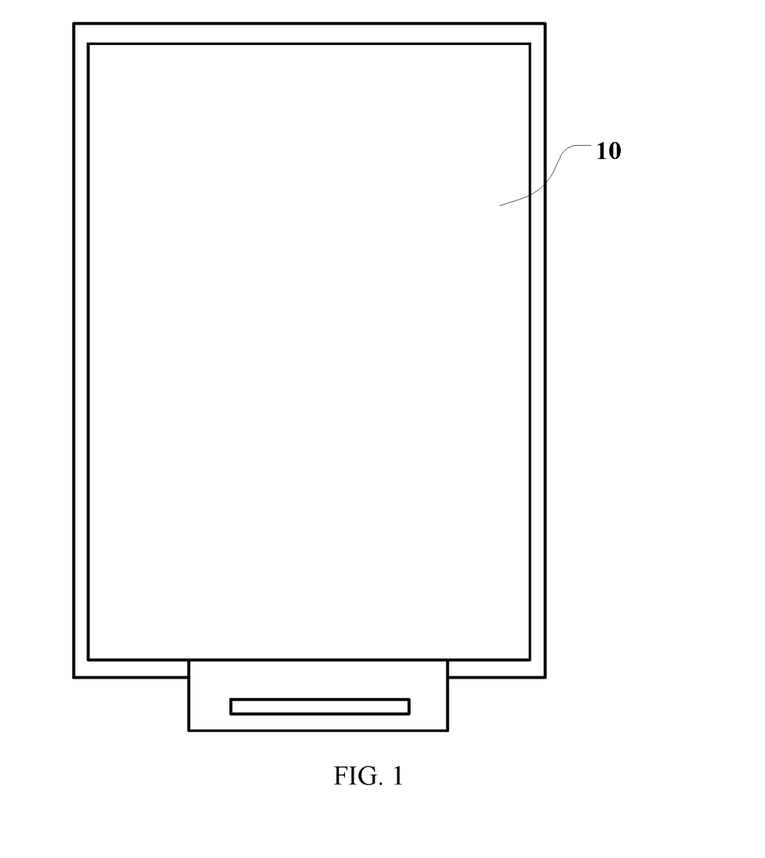
FIG. 1 illustrates a schematic top view of an exemplary display panel consistent with the disclosed embodiments.

FIG. 1 illustrates a schematic top view of an exemplary display panel 10 consistent with the disclosed embodiments. As shown in FIG. 1, the display panel 10 may include a light-emitting element. In one embodiment, the display panel 10 may be an organic light-emitting display panel, which may include an anode, a cathode, and an organic light-emitting layer sandwiched between the anode and the cathode. A voltage may be applied between the anode and the cathode to excite carrier migration, enabling the organic light-emitting layer to emit light. In another embodiment, the display panel 10 may be any appropriate display panel, such as a quantum dot light-emitting display panel, a nano-wafer light-emitting display panel, etc., which is not limited by the present disclosure.

Figure 2:
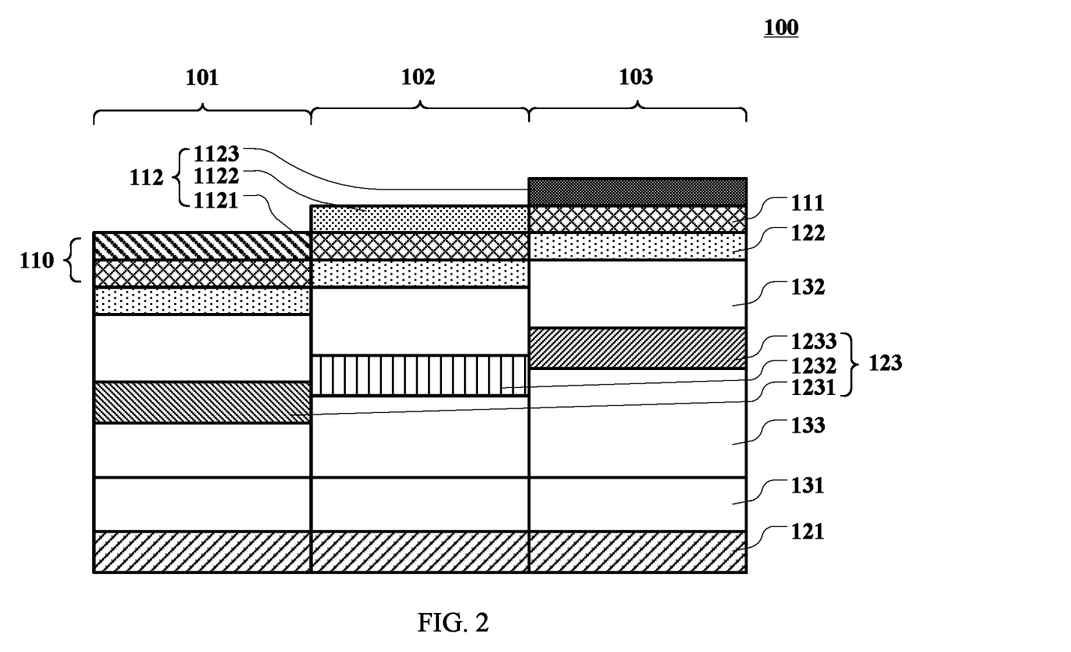
FIG. 2 illustrates a schematic cross-sectional view of an exemplary light-emitting element consistent with the disclosed embodiments.

FIG. 2 illustrates a schematic cross-sectional view of an exemplary light-emitting element 100 consistent with the disclosed embodiments. As shown in FIG. 2, the light-emitting element 100 may include a first light-emitting element 101 that emits a first color light having a wavelength range of $\lambda 1$ to $\lambda 2$, and a second light-emitting element 102 that emits a second color light having a wavelength range of $\lambda 3$ to $\lambda 4$ and a third light-emitting element 103 that emits a third color light having a wavelength range of $\lambda 5$ to $\lambda 6$, and a capping layer 110 disposed at a light exit side of the light-emitting element 100. The arrow in FIG. 2 denotes the light-emitting direction of the light-emitting element 100.

Further, the capping layer 110 may include a first capping layer 111 and a second capping layer 112 stacked together. The first capping layer 111 may have a first side facing the light exit side of the light-emitting element 100 and an opposing second side, and the second capping layer 112 may be disposed at the first side of the first capping layer 111. The second capping layer 112 may include a first sub-capping layer 1121 correspondingly disposed at a light exit side of the first light-emitting element 101, a second sub-capping layer 1122 correspondingly disposed at a light exit side of the second light-emitting element 102 and a third capping layer 1123 correspondingly disposed at a light exit side of the third light-emitting element 103. At least one of the first sub-capping layer 1121, the second sub-capping layer 1122, or the third sub-capping layers 1123 may be configured to have a larger refractive index of light emitted by the corresponding light-emitting element than light emitted by other light-emitting elements.

In the disclosed embodiments, the light-emitting element 100 may further include an anode 121 and a cathode 122 disposed opposite to each other, and a light-emitting layer 123 disposed between the anode 121 and the cathode 122. A hole transport layer 131 may be disposed between the anode 121 and the light-emitting layer 123, and an electron transport layer 132 may be disposed between the cathode 122 and the light-emitting layer 123. Further, an optical adjustment layer 133 may be disposed between the hole transport layer 131 and the light-emitting layer 123. The thickness of the optical adjustment layer 133 may vary according to the color of the light emitted by the light-emitting element, so that the microcavity length of the light-emitting elements of different colors may be adjusted accordingly.

The light-emitting layer 123 may include a first light-emitting layer 1231, a second light-emitting layer 1232, and a third light-emitting layer 1233. The first light-emitting element 101 may include the first light-emitting layer 1231 that emits the first color light having the wavelength range of $\lambda 1$ to $\lambda 2$. The second light-emitting element 102 may include the second light-emitting layer 1232 that emits the second color light having the wavelength range of $\lambda 3$ to $\lambda 4$, and the third light-emitting element 103 may include the third light-emitting layer 1233 that emits the third color light having the wavelength range of $\lambda 5$ to $\lambda 6$. In one embodiment, the light-emitting element 100 may be a top-emitting device, i.e., the anode 121 may be a total reflective electrode, the cathode 122 may be a semi-transparent electrode, light may be emitted from the cathode 122 side, and the capping layer 110 may be disposed at the cathode 122.

Figure 3:
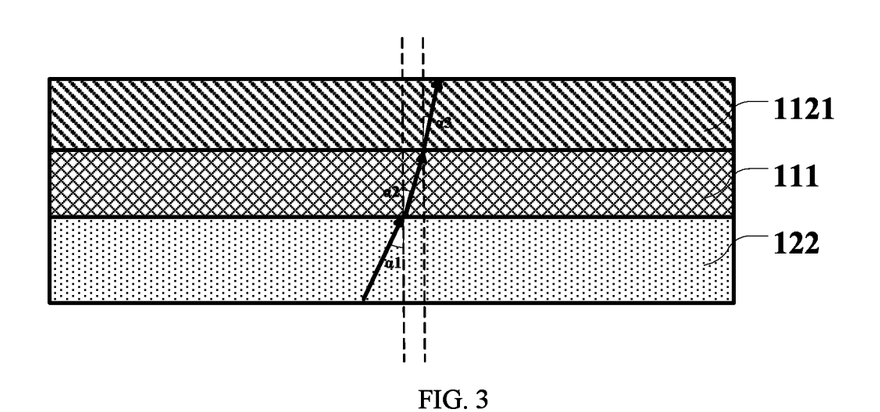
FIG. 3 illustrates light propagation in an exemplary capping layer consistent with the disclosed embodiments.

In the disclosed embodiments, the capping layer 110 may be made of an organic transparent material, and may be capable of improving the exit angle of the emitted light. FIG. 3 illustrates light propagation in an exemplary capping layer consistent with the disclosed embodiments. For illustrative purposes, FIG. 3 shows light propagation in the capping layer correspondingly disposed at the first light-emitting element 101. Referring to FIG. 2 and FIG. 3, the light emitted by the first light-emitting element 101 may be incident onto the first capping layer 111 after transmitted through the cathode 122. To improve the light extraction efficiency, for the light having the wavelength range of $\lambda 1$ to $\lambda 6$, the first capping layer 111 may be configured to have a larger refractive index than the cathode 122, and the first sub-capping layer 1121 of the second capping layer 112 may be configured to have a larger refractive index than the first capping layer 111.

According to the law of refraction, $\alpha 3 < \alpha 2 < \alpha 1$, where $\alpha 1$ is the angle of incidence and $\alpha 2$ is the angle of refraction when the light is incident onto the interface between the cathode 122 and the first capping layer 111, and $\alpha 3$ is the angle of refraction when the light is incident onto the interface between the first capping layer 111 and the first sub-capping layer 1121 of the second capping layer 112. That is, when the light passes from the cathode 122 to the first sub-capping layer 1121, the propagating direction of the light may gradually approach the normal exit direction, i.e., the normal of the light exit surface. Therefore, the light which could be emitted to the outside of the display panel may be increased, while the light loss caused by totally internal reflection at the interface between the cathode 122 and the first capping layer 111 when $\alpha 1$ is too large may be suppressed. Accordingly, the light extraction efficiency of the display panel may be improved.

In the disclosed embodiments, the capping layer 110 may be disposed at the light exit side of the light-emitting element 100. The capping layer 110 may include the first capping layer 111 and the second capping layer 112 disposed at the first side of the first capping layer 111. The second capping layer 112 may include the first sub-capping layer 1121 correspondingly disposed at the light exit side of the first light-emitting element 101, the second sub-capping layer 1122 correspondingly disposed at the light exit side of the second light-emitting element 102 and the third sub-capping layer 1123 correspondingly disposed at the light exit side of the third light-emitting element 103. Through configuring at least one of the first sub-capping layer 1121, the second sub-capping layer 1122, or the third sub-capping layer 1123 to have a larger refractive index of the light emitted by the corresponding light-emitting element than the light emitted by the other light-emitting elements, the capping layers corresponding to the respective light-emitting units that emit light of different colors may be enabled to facilitate the extraction of the light passing through the capping layers. Thus, the extraction of light in different colors may be optimized, the contrast ratio of the display panel may be improved, and the display performance of the display panel may be enhanced.

In one embodiment, for the light having the wavelength range of λ1 to λ6, the first sub-capping layer 1121, the second sub-capping layer 1122, and the third sub-capping layer 1123 each may be configured to have a larger refractive index than the first capping layer 111. As described above, when the refractive indices of the second capping layer 112, the first capping layer 111, and the cathode 122 are gradually increased, more light may be extracted from the light-emitting element. Thus, through configuring each of the first sub-capping layer 1121, the second sub-capping layer 1122, and the third sub-capping layer 1123 to have a larger refractive index than the first capping layer 111, the light of different colors may be extracted as much as possible, and the light extraction difference caused by the wavelength difference may be suppressed.

In one embodiment, the first capping layer 111 may be configured to have a refractive index $n_{1(\lambda1\sim\lambda2)}$ of the first color light having the wavelength range of λ1 to λ2, a refractive index $n_{1(\lambda3\sim\lambda4)}$ of the second color light having the wavelength range of λ3 to λ4 and a refractive index $n_{1(\lambda5\sim\lambda6)}$ of the third color light having the wavelength range of λ5 to λ6, where $n_{1(\lambda1\sim\lambda2)} > n_{1(\lambda3\sim\lambda4)}$ and $n_{1(\lambda1\sim\lambda2)} > n_{1(\lambda5\sim\lambda6)}$. Because the same material has different refractive indices for light of different wavelength and the first capping layer 111 is disposed on each light-emitting element, the first capping layer 111 may have different refractive indices for light of different wavelength.

In one embodiment, the second sub-capping layer 1122 may have a refractive index $n_{22(\lambda3\sim\lambda4)}$ of the second color light having the wavelength range λ3 to λ4, where $|n_{22(\lambda3\sim\lambda4)} - n_{1(\lambda1\sim\lambda2)}| < |n_{1(\lambda1\sim\lambda2)} - n_{1(\lambda3\sim\lambda4)}|$. Such a refractive index design may enable the second sub-capping layer 1122 to compensate the light loss of the second color light caused by the refractive index of the first capping layer 111. Thus, the refractive index of the first color light having the wavelength range of λ1 to λ2 and the refractive index of the second color light having the wavelength range of λ3 to λ4 may reach a same convergence without a significant difference, thereby ensuring the contrast ratio of the display panel.

In one embodiment the third sub-capping layer 1123 may have a refractive index of $n_{23(\lambda5\sim\lambda6)}$ of the third color light having the wavelength range of λ5 to λ6, where $|n_{23(\lambda5\sim\lambda6)} - n_{1(\lambda1\sim\lambda2)}| < |n_{1(\lambda1\sim\lambda2)} - n_{1(\lambda5\sim\lambda6)}|$ and $|n_{23(\lambda5\sim\lambda6)} - n_{1(\lambda3\sim\lambda4)}| < |n_{1(\lambda3\sim\lambda4)} - n_{1(\lambda5\sim\lambda6)}|$. Such a refractive index design may enable the third sub-capping layer 1123 to compensate the light loss of the third color light caused by the refractive index of the first capping layer 111. Thus, the refractive index of the first color light having the wavelength range of λ1 to λ2 and the refractive index of the third color light having the wavelength range of λ5 to λ6 may reach a same convergence without a significant difference, thereby ensuring the contrast ratio of the display panel.

In one embodiment, for the first light-emitting element 101, the first sub-capping layer 1121 may be configured to have a larger refractive index of the first color light having the wavelength range of λ1 to λ2 than both the second color light having the wavelength range of λ3 to λ4 and the third color light having the wavelength range of λ5 to λ6. For the second light-emitting element 102, the second sub-capping layer 1122 may be configured to have a larger refractive index of the second color light having the wavelength range of λ3 to λ4 than both the first color light having the wavelength range of λ1 to λ2 and the third color light having the wavelength range of λ5 to λ6. For the third light-emitting element 103, the third sub-capping layer 1123 may be configured to have a larger refractive index of the third color light having the wavelength range of λ5 to λ6 than the first color light having the wavelength range of λ1 to λ2 and the second color light having the wavelength range of λ3 to λ4. Thus, the first color light, the second color light and the third second color light may be sufficiently extracted from the first light-emitting element 101, the second light-emitting element 102, and the third light-emitting element 103, respectively. That is, the light of different colors may be all sufficiently extracted, such that the light extraction difference caused by wavelength difference may be suppressed, and the light extraction efficiency and the contrast ratio of the display panel may be ensured.

In one embodiment, λ1=400 nm, λ2=490 nm, i.e., the first color light may be blue light; λ3=500 nm, λ4=580 nm, i.e., the second color light may be green light; and λ5=600 nm, λ6=720 nm, i.e., the third color light may be red light. Because for the incident light having the same energy, human eyes may feel that the green light has a higher spectral luminous efficiency than the blue light and red light, the loss of red light or blue light will cause color cast in human eyes easily. In view of this, in one embodiment, the first sub-capping layer 1121 and the second sub-capping layer 1122 may be configured with the same material, while the first sub-capping layer 1121 and the third sub-capping layer 1123 may be configured with different materials. Thus, the light extraction efficiency of the red light and blue light may be adjusted. The capping layers of the green light and red light may be configured with the same material, such a design may not result a large loss of the green light because the human eyes have a strong perception of the green light, while the fabrication process and cost may be reduced. In another embodiment, the third sub-capping layer 1123 and the second sub-capping layer 1122 configured with the same material, while the first sub-capping layer 1121 and the third sub-capping layer 1123 may be configured with different materials, which may also reduce the fabrication process and cost.

In another embodiment, each of the first sub-capping layer 1121, the second sub-capping layer 1122, and the third sub-capping layer 1123 may be configured with a different material, such that the light extraction efficiency of various colors may be accurately controlled. Accordingly, the light extraction efficiency and the contrast ratio of the display panel may be improved.

In one embodiment, the first capping layer 111 may include a material represented by the chemical formula I, or other appropriate materials. Further, for light having a wavelength range of λ1 to λ6, the refractive index of the first capping layer 111 may be in a range of approximately 1.6 to 2.2, so that the light emitted from the cathode may be extracted.

Chemical formula I

The material of the first sub-capping layer 1121 may include at least one of an aromatic amine, a carbazole, or a dihydro acridine compound, where such materials may have a higher refractive index for blue light than for other color light. Thus, the light extraction efficiency of the blue light may be improved.

The material of the third sub-capping layer 1123 may include at least one of phenanthroline, benzimidazole, benzoacridine, dibenzoacridine or bipyridine, where such materials may have a higher refractive index for red light than for other color light. Thus, the light extraction efficiency of the red light may be improved.

The material of the second sub-capping layer 1122 may be the same as the material of the first sub-capping layer 1121 or the material of the third sub-capping layer 1123.

In one embodiment, the refractive index $n_{21(\lambda 1 \sim \lambda 2)}$ of the first sub-capping layer 1121 for the first color light having the wavelength range of λ1 to λ2 may be configured to be approximately $1.75 \leq n_{21(\lambda 1 \sim \lambda 2)} \leq 2.50$. The refractive index $n_{22(\lambda 3 \sim \lambda 4)}$ of the second sub-capping layer 1122 for the second color light having the wavelength range of λ3 to λ4 may be configured to be approximately $1.70 \leq n_{22(\lambda 3 \sim \lambda 4)} \leq 2.40$. The refractive index $n_{23(\lambda 5 \sim \lambda 6)}$ of the third sub-capping layer 1123 for the third color light having the wavelength range of λ5 to λ6 may be configured to be approximately $1.65 \leq n_{23(\lambda 5 \sim \lambda 6)} \leq 2.30$. Thus, the light extraction efficiency of various colors of light may be ensured, thereby ensuring the light extraction efficiency and contrast ratio of the display panel.

Figure 4:
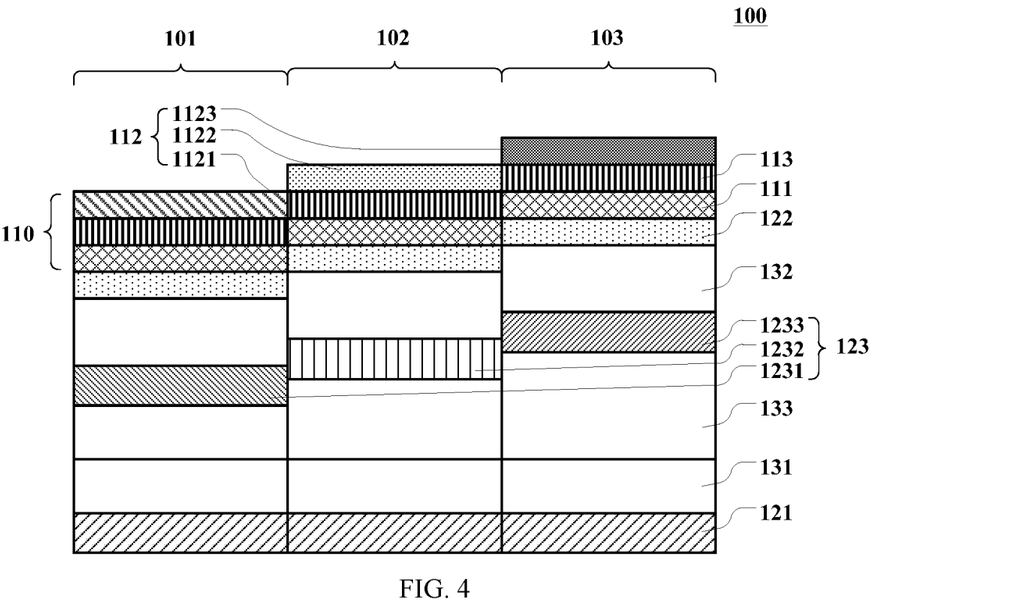
FIG. 4 illustrates a schematic cross-sectional view of another exemplary light-emitting component consistent with the disclosed embodiments.

FIG. 4 illustrates a schematic cross-sectional view of another exemplary light-emitting component consistent with the disclosed embodiments. The similarities between FIG. 4 and FIG. 2 are not explained, while certain difference may be explained.

As shown in FIG. 4, the display panel 10 may further include a third capping layer 113 stacked with the first capping layer 111 and the second capping layer 112, where the third capping layer 113 may be disposed between the first capping layer 111 and the second capping layer 112. For the light having a wavelength range of λ1 to λ6, the third capping layer 113 may have a larger refractive index than the first capping layer 111, but a smaller refractive index than each of the first sub-capping layer 1121, the second sub-capping layer 1122, and the third sub-capping layer 1123.

According to the law of refraction, the light transmitted through the first capping layer 111, the third capping layer 113, and the second capping layer 112 may gradually approach the normal direction of the light exit surface, thereby sufficiently improving the light extraction efficiency.

Figure 5:
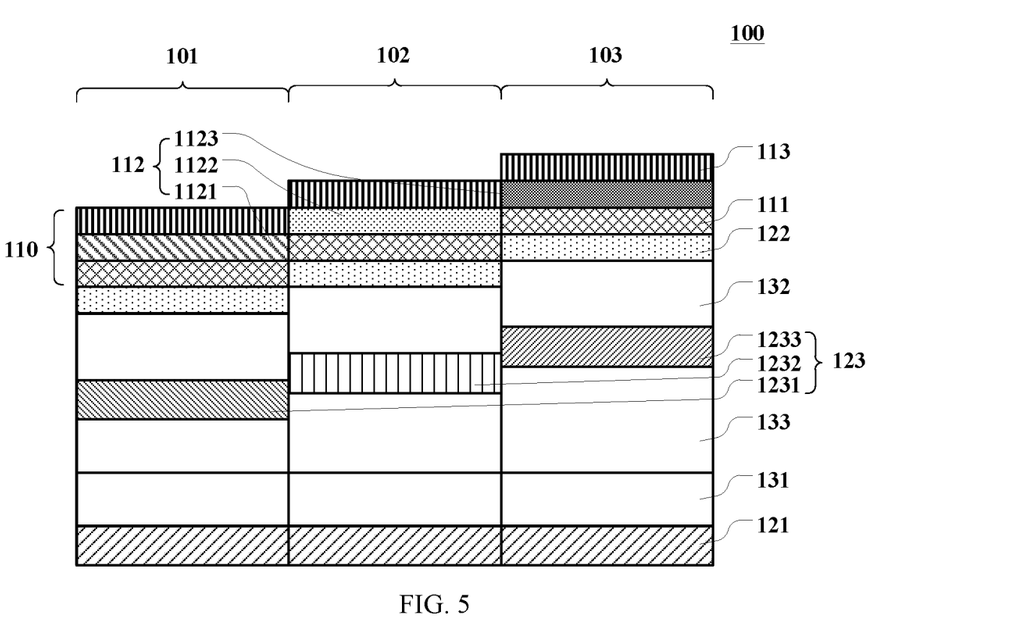
FIG. 5 illustrates a schematic cross-sectional view of another exemplary light-emitting component consistent with the disclosed embodiments.

FIG. 5 illustrates a schematic cross-sectional view of another exemplary light-emitting component consistent with the disclosed embodiments. The similarities between FIG. 4 and FIG. 5 are not explained, while certain difference may be explained.

As shown in FIG. 5, the display panel 10 may further include a third capping layer 113 stacked with the first capping layer 111 and the second capping layer 112. The second capping layer 112 may have a first side facing the light exit side of the light-emitting element 100 and an opposing second side, and the third capping layer 113 may be disposed at the first side of the second capping layer 112. For the light having a wavelength range of λ1 to λ6, the third capping layer 113 may have a larger refractive index than each of the first sub-capping layer 1121, the second sub-capping layer 1122, and the third sub-capping layer 1123. According to the law of refraction, the light transmitted through the first capping layer 111, the second capping layer 112 and the third capping layer 113 may gradually approach the normal direction of the light exit surface, thereby sufficiently improving the light extraction efficiency.

In one embodiment, at least two of the first sub-capping layer 1121, the second sub-capping layer 1122, and the third sub-capping layer 1123 may be not connected, i.e., disconnected. The first capping layer 111 may be disposed as a whole at the first light-emitting element 101, the second light-emitting element 102, and the third light-emitting element 103. The first capping layer 111 itself may have a certain light extraction effect. Thus, the first sub-capping layer 1121 may be disposed only at the first light-emitting element 101, the second sub-capping layer 1122 may be disposed only at the second light-emitting element 102, and the third sub-capping layer 1123 may be disposed only at the third light-emitting element 103. The sub-capping layer may be not disposed at a non-light-emitting area between the light-emitting elements, such that the function of each sub-capping layer may be achieved, while the material and cost may be reduced.

In one embodiment, the first capping layer 111 may be doped with scattering particles. In an existing light-emitting element, the anode is configured as a total reflection electrode and the cathode is configured as a semi-reflective electrode, through which a microcavity effect is established between the cathode and the anode. The microcavity effect improves the color purity of the light, but also causes wide-angle interference in the light-emitting element, which leads to a color shift at different viewing angles. In the disclosed embodiments, through doping a small number of scattering particles into the first capping layer 111, the propagation direction of the emitted light may be disturbed, thereby destroying the wide-angle interference to some extent, and improving the color shift at different viewing angles.

The present disclosure further provides a display device, including any one of the disclosed display panels.

Figure 6:
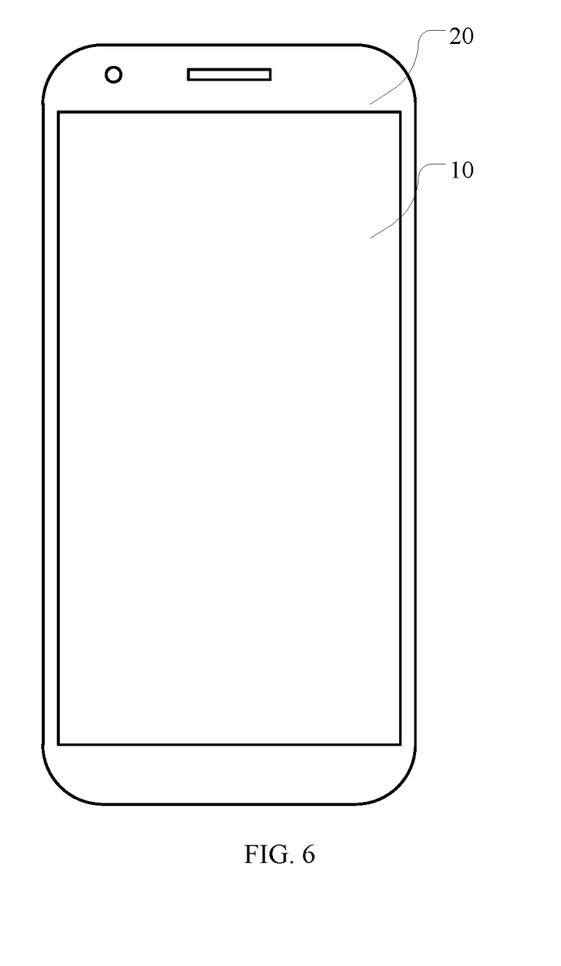
FIG. 6 illustrates an exemplary display device consistent with the disclosed embodiments.

FIG. 6 illustrates an exemplary display device 20 consistent with the disclosed embodiments. As shown in FIG. 6, the display device 20 may include a display panel 10 which is any one of the disclosed display panels. FIG. 6 shows the display device 20 may be a mobile phone, which is for illustrative purposes and is not intended to limit the scope of the present disclosure. The display device 20 may also be any display device with a display function such as a laptop, a television, a tablet, and a wearable device, etc., which may be not limited by the present discourse. Because the disclosed display device may include any one of the disclosed display panels, the disclosed display device may also have the same features as the disclosed display panel, and details are not described herein again.

In the discoed embodiments, the capping layer may be disposed at the light exit side of the light-emitting element. The capping layer may include the first capping layer and the second capping layer disposed at the first side of the first capping layer (i.e., the side facing the light exit side of the light-emitting element). The second capping layer may include the first sub-capping layer, the second sub-capping layer and the third sub-capping layer corresponding to the first light-emitting element, the second light-emitting element and the third light-emitting element, respectively. Through configuring at least one of the first sub-capping layer, the second sub-capping layer, or the third sub-capping layer to have a larger refractive index of the light emitted by the corresponding light-emitting element than the light emitted by the other light-emitting elements, the capping layers corresponding to the respective light-emitting units that emit light of different colors may be enabled to facilitate the extraction of the light passing through the capping layers. Thus, the extraction of light of different colors may be optimized, the contrast ratio of the display panel may be improved, and the display performance of the display panel may be enhanced.

Various embodiments have been described to illustrate the operation principles and exemplary implementations. It should be understood by those skilled in the art that the present disclosure may be not limited to the specific embodiments described herein and that various other obvious changes, rearrangements, and substitutions will occur to those skilled in the art without departing from the scope of the disclosure. Thus, while the present disclosure may have been described in detail with reference to the above described embodiments, the present disclosure may be not limited to the above described embodiments, but may be embodied in other equivalent forms without departing from the scope of the present disclosure, which may be determined by the appended claims.

What may be claimed is:

1. A display panel, comprising:
a light-emitting element including a first light-emitting element that emits a first color light having a wavelength range of $\lambda 1$ to $\lambda 2$, a second light-emitting element that emits a second color light having a wavelength range of $\lambda 3$ to $\lambda 4$ and a third light-emitting element that emits a third color light having a wavelength range of $\lambda 5$ to $\lambda 6$, and
a capping layer disposed at a light exit side of the light-emitting element and including a first capping layer and a second capping layer stacked together, wherein the first capping layer has a first side facing the light exit side of the light-emitting element and an opposing second side, the second capping layer is disposed at the first side of the first capping layer, the second capping layer includes a first sub-capping layer correspondingly disposed at a light exit side of the first light-emitting element, a second sub-capping layer correspondingly disposed at a light exit side of the second light-emitting element and a third sub-capping layer correspondingly disposed at a light exit side of the third light-emitting element,
wherein at least one of the first sub-capping layer, the second sub-capping layer, or the third sub-capping layers is configured to have a larger refractive index of light emitted by the corresponding light-emitting element than light emitted by other light-emitting elements.

2. The display panel according to claim 1, wherein:
for light having a wavelength range of $\lambda 1$ to $\lambda 6$, the first sub-cap layer, the second sub-capping layer and the third sub-capping layer each is configured to have a larger refractive index than the first capping layer.

3. The display panel according to claim 1, wherein:
the first capping layer is configured to have a refractive index $n_{1(\lambda 1 \sim \lambda 2)}$ of the first color light, a refractive index $n_{1(\lambda 3 \sim \lambda 4)}$ of the second color light and a refractive index $n_{1(\lambda 5 \sim \lambda 6)}$ of the third color light, where $n_{1(\lambda 1 \sim \lambda 2)} > n_{1(\lambda 3 \sim \lambda 4)}$ and $n_{1(\lambda 1 \sim \lambda 2)} > n_{1(\lambda 5 \sim \lambda 6)}$.

4. The display panel according to claim 3, wherein:
the second sub-capping layer is configured to have a refractive index $n_{22(\lambda 3 \sim \lambda 4)}$ of the second color light, where $|n_{22(\lambda 3 \sim \lambda 4)} - n_{1(\lambda 1 \sim \lambda 2)}| < |n_{1(\lambda 1 \sim \lambda 2)} - n_{1(\lambda 3 \sim \lambda 4)}|$.

5. The display panel according to claim 3, wherein:
the third sub-capping layer is configured to have a refractive index of $n_{23(\lambda 5 \sim \lambda 6)}$ of the third color light, where $|n_{23(\lambda 5 \sim \lambda 6)} - n_{1(\lambda 1 \sim \lambda 2)}| < |n_{1(\lambda 1 \sim \lambda 2)} - n_{1(\lambda 5 \sim \lambda 6)}|$ and $|n_{23(\lambda 5 \sim \lambda 6)} - n_{1(\lambda 3 \sim \lambda 4)}| < |n_{1(\lambda 3 \sim \lambda 4)} - n_{1(\lambda 5 \sim \lambda 6)}|$.

6. The display panel according to claim 1, wherein:
the first sub-capping layer is configured to have a larger refractive index of the first color light than both the second color light and the third color light;
the second sub-capping layer is configured to have a larger refractive index of the second color light than both the first color light and the third color light; and
the third sub-capping layer is configured to have a larger refractive index of the third color light than both the first color light and the second color light.

7. The display panel according to claim 1, wherein:
λ1=400 nm, λ2=490 nm, λ3=500 nm, λ4=580 nm, λ5=600 nm, and λ6=720 nm.

8. The display panel according to claim 7, wherein:
the first color light is blue light;
the second color light is green light; and
the third color light is red light.

9. The display panel according to claim 8, wherein:
the first sub-capping layer and the second sub-capping layer are configured with a same material; and
the first sub-capping layer and the third sub-capping layer are configured with different materials.

10. The display panel according to claim 8, wherein:
the second sub-capping layer and the third sub-capping layer are configured with a same material; and
the first sub-capping layer and the third sub-capping layer are configured with different materials.

11. The display panel according to claim 8, wherein:
each of the first sub-capping layer, the second sub-capping layer, and the third sub-capping layer is configured with a different material.

12. The display panel according to claim 8, wherein:
a material of the first sub-capping layer includes at least one of an aromatic amine, a carbazole, or a dihydro acridine compound.

13. The display panel according to claim 8, wherein:
a material of the third sub-capping layer includes at least one of phenanthroline, benzimidazole, benzoacridine, dibenzoacridine or bipyridine.

14. The display panel according to claim 1, wherein:
a refractive index $n_{21(\lambda 1 \sim \lambda 2)}$ of the first sub-capping layer for the first color light is configured to be approximately $1.75 \leq n_{21(\lambda 1 \sim \lambda 2)} \leq 2.50$;
the refractive index $n_{22(\lambda 3 \sim \lambda 4)}$ of the second sub-capping layer for the second color light is configured to be approximately $1.70 \leq n_{22(\lambda 3 \sim \lambda 4)} \leq 2.40$; and
the refractive index $n_{23(\lambda 5 \sim \lambda 6)}$ of the third sub-capping layer for the third color light is configured to be approximately $1.65 \leq n_{23(\lambda 5 \sim \lambda 6)} \leq 2.30$.

15. The display panel according to claim 1, further comprising:
a third capping layer stacked with the first capping layer and the second capping layer.

16. The display panel according to claim 15, wherein:
the third capping layer is disposed between the first capping layer and the second capping layer; and
for light having a wavelength range of λ1 to λ6, the third capping layer has a larger refractive index than the first capping layer, but a smaller refractive index than each of the first sub-capping layer, the second sub-capping layer, and the third sub-capping layer.

17. The display panel according to claim 15, wherein:
the second capping layer has a first side facing the light exit side of the light-emitting element and an opposing second side, and the third capping layer is disposed at the first side of the second capping layer; and
for light having a wavelength range of λ1 to λ6, the third capping layer has a larger refractive index than each of the first sub-capping layer, the second sub-capping layer, and the third sub-capping layer.

18. The display panel according to claim 1, wherein:
at least two of the first sub-capping layer, the second sub-capping layer, and the third sub-capping layer are disconnected.

19. The display panel according to claim 1, wherein:
the first capping layer is doped with scattering particles.

20. A display device, comprising:
a display panel, wherein the display panel comprises:
a light-emitting element including a first light-emitting element that emits a first color light having a wavelength range of λ1 to λ2, a second light-emitting element that emits a second color light having a wavelength range of λ3 to λ4, and a third light-emitting element that emits a third color light having a wavelength range of λ5 to λ6, and
a capping layer disposed at a light exit side of the light-emitting element and including a first capping layer and a second capping layer stacked together, wherein the first capping layer has a first side facing the light exit side of the light-emitting element and an opposing second side, the second capping layer is disposed at the first side of the first capping layer, the second capping layer includes a first sub-capping layer correspondingly disposed at a light exit side of the first light-emitting element, a second sub-capping layer correspondingly disposed at a light exit side of the second light-emitting element and a third sub-capping layer correspondingly disposed at a light exit side of the third light-emitting element,
wherein at least one of the first sub-capping layer, the second sub-capping layer, or the third sub-capping layers is configured to have a larger refractive index of light emitted by the corresponding light-emitting element than light emitted by other light-emitting elements.

* * * * *